United States Patent
Park

(10) Patent No.: US 7,768,843 B2
(45) Date of Patent: Aug. 3, 2010

(54) SEMICONDUCTOR MEMORY DEVICE FOR GENERATING BACK-BIAS VOLTAGE WITH VARIABLE DRIVING FORCE

(75) Inventor: Jae-Boum Park, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 102 days.

(21) Appl. No.: 12/165,028

(22) Filed: Jun. 30, 2008

(65) Prior Publication Data
US 2009/0168556 A1 Jul. 2, 2009

(30) Foreign Application Priority Data
Dec. 27, 2007 (KR) .............. 10-2007-0138582

(51) Int. Cl.
*G11C 7/00* (2006.01)
(52) U.S. Cl. .............. 365/189.09; 365/189.11; 365/226; 365/228; 365/229
(58) Field of Classification Search ............ 365/189.09, 365/226, 189.11, 228, 229
See application file for complete search history.

(56) References Cited

U.S. PATENT DOCUMENTS

| | | | | |
|---|---|---|---|---|
| 5,315,557 A | * | 5/1994 | Kim et al. | 365/222 |
| 5,886,567 A | * | 3/1999 | Park et al. | 327/537 |
| 5,920,226 A | * | 7/1999 | Mimura | 327/537 |
| 7,366,048 B2 | * | 4/2008 | Byeon | 365/226 |

FOREIGN PATENT DOCUMENTS

| | | |
|---|---|---|
| KR | 100172370 B1 | 10/1998 |
| KR | 1020040051743 A | 6/2004 |
| KR | 1020050005037 A | 1/2005 |
| KR | 1020070101911 A | 10/2007 |

OTHER PUBLICATIONS

Notice of Preliminary Rejection issued from Korean Intellectual Property Office on Apr. 28, 2009 with an English Translation.
Notice of Allowance issued from Korean Intellectual Property Office on Aug. 7, 2009 with an English Translation.

* cited by examiner

*Primary Examiner*—Connie C Yoha
(74) *Attorney, Agent, or Firm*—IP & T Law Firm PLC

(57) ABSTRACT

A semiconductor memory device is capable of maintaining a predetermined back-bias voltage level regardless of operation modes of the semiconductor memory device, by generating a back-bias voltage with driving force changed according to the operation modes. The semiconductor memory device includes an active pumping control signal generating unit for generating an active pumping control signal in response to a plurality of active signals, a voltage detecting unit for detecting a voltage level of a back-bias voltage terminal to output a detection signal, an oscillator for generating an oscillation signal oscillating at a predetermined frequency in response to the detection signal, and a charge pumping unit for performing a charge pumping operation in response to the oscillation signal by controlling a force of driving the back-bias voltage terminal in response to the active pumping control signal.

10 Claims, 4 Drawing Sheets

SEMICONDUCTOR MEMORY DEVICE FOR GENERATING BACK-BIAS VOLTAGE WITH VARIABLE DRIVING FORCE

CROSS-REFERENCE TO RELATED APPLICATION

The present application claims priority to Korean application number 10-2007-0138582, filed on Dec. 27, 2007, which is incorporated by reference in its entirety.

BACKGROUND OF THE INVENTION

The present invention relates to a semiconductor design technology, and more particularly to a back-bias voltage generating circuit of the semiconductor memory device. The back-bias voltage generating circuit is capable of generating a back-bias voltage with variable driving force corresponding to operation modes of the semiconductor memory device.

Most semiconductor devices headed by DRAMs are provided with an internal voltage generator in a chip to generate a plurality of internal voltages for themselves. The plurality of internal voltages, which are required to operate internal circuits in the chip, are generated to a plurality of voltage levels by using a power supply voltage VDD and a ground voltage VSS from an external circuit.

Generally, to generate the plurality of level of internal voltages, a reference voltage signal having a reference voltage level is generated. And then, the internal voltages are provided based on the reference voltage signal though various techniques such as a charge pumping or down-converting operation.

Here, typical internal voltages which are generated by the charge pumping operation are a boosted voltage VPP and a back-bias voltage VBB. A typical internal voltage which is generated by the down-converting operation is a core voltage VCORE.

The core voltage VCORE is lower than the external power supply voltage VDD and is higher than the ground voltage VSS. This voltage is required to reduce power consumption in maintaining the voltage level of data, which are stored in memory cells, and to maintain a stable operation of cell transistors.

The boosted voltage VPP is higher than the external power supply voltage VDD. This voltage is required to be supplied to a word line which is connected to a gate of a cell transistor when a memory cell is accessed. This boosted voltage VPP prevents the cell data loss which is caused by the threshold voltage (Vth) of the cell transistor.

Also, the back-bias voltage VBB is lower than the external ground voltage VSS. The back-bias voltage VBB reduces the variation of the threshold voltage Vth of the cell transistor which is caused by the body effect. Accordingly, the back-bias voltage VBB increases the stabilization of the cell transistor and reduces a channel leakage current generated in the cell transistor.

An internal voltage generator for generating the above-mentioned internal voltages VPP, VBB and VCORE is designed with a deviation whithin operation voltage and temperature range of a semiconductor memory device. However, the coupling effect can be caused by parasitic capacitance between the back bias voltage and the boosted voltage because of the structure of MOS transistors which are employed in a peripheral circuit such as a word line control circuit.

FIG. 1 is a cross-sectional view illustrating a structure of a MOS transistor used in a peripheral circuit of a conventional semiconductor memory device.

Referring to FIG. 1, the peripheral circuit surrounding memory cells has a structure in which a deep N-well is formed within a P-type substrate and a P-well is formed within the deep N-well. Particularly, $P^+$-type regions are further formed as drain and source regions of a PMOS transistor 100 in the deep N-well, and $N^+$-type regions are formed as drain and source regions of an NMOS transistor 120 in the P-well. At this time, a boosted voltage VPP is applied to the source region of the PMOS transistor 100 and a ground voltage VSS is applied to the source region of the NMOS transistor 120.

A bias voltage terminal of the PMOS transistor 100, i.e., an $N^+$-type, is applied with the boosted voltage VPP. Further, a bias voltage terminal of the NMOS transistor 120, i.e., a $P^+$-type region is applied with a back-bias voltage VBB.

As mentioned above, the booted voltage VPP and the back-bias voltage VBB, which have a maximum voltage difference from each other in the semiconductor memory device, are applied to the bias voltage terminals of the PMOS transistor 100 and the NMOS transistor 120, respectively. Accordingly, as shown in FIG. 1, a parasite capacitor 140 is generated between the P-well region and the N-well region. There is a problem in that a level fluctuation of the back-bias voltage VBB is caused by a level fluctuation of the boosted voltage VPP due to the coupling effect of the parasitic capacitor 140 in spite of effects to reduce the level fluctuation of the back-bias voltage VBB. On the contrary, in spite of effects to reduce the level fluctuation of the boosted voltage VPP, the boosted voltage VPP cab be fluctuated according to the level fluctuation of the back-bias voltage VBB.

That is, a circuit to produce the boosted voltage VPP competes with a circuit to produce the back-bias voltage VBB. In this competition, the one to have a relatively strong driving force leads the other to have a relatively weak driving force.

As mentioned above, when the circuit to produce the boosted voltage VPP competes with the circuit to produce the back-bias voltage VBB, the circuit to produce the back-bias voltage VBB is generally drawn to the circuit to produce the boosted voltage VPP in a conventional semiconductor device. That is, when the boosted voltage VPP is fluctuated, for example, when the boosted voltage VPP goes up, the back-bias voltage VBB also goes up with the increase of the boosted voltage VPP.

The reason why the back-bias voltage VBB goes up with the increase of the boosted voltage VPP is that the circuit to produce the boosted voltage VPP is different from the circuit to produce the back-bias voltage VBB in a circuit design structure. This difference in the circuit design structures will be illustrated below.

FIG. 2 is a block diagram illustrating conventional circuits to generate the boosted voltage VPP and the back-bias voltage VBB of a semiconductor memory device.

Referring to FIG. 2, the conventional circuit to generate the back-bias voltage VBB includes a back-bias voltage detecting unit 200, an oscillator 210, and a back-bias charge pumping unit 220. The back-bias voltage detecting unit 200 detects a voltage level of a back-bias voltage VBB relative to a reference voltage VREF_VBB. The oscillator 210 produces an oscillation signal VBB_OSC at a predetermined frequency in response to a detection signal VBB_DET of the back-bias voltage detecting unit 200. The back-bias charge pumping unit 220 drives a back-bias voltage terminal by performing a charge pumping operation in response to the oscillation signal VBB_OSC.

Meanwhile, the conventional circuit to generate the boosted voltage VPP includes a boost voltage detecting unit 250, first and second boost voltage oscillators 260 and 270, a first boost voltage charge pumping unit 280, and a second boost voltage charge pumping unit 290. The boost voltage detecting unit 250 detects a voltage level of a boost voltage VPP relative to reference voltage VREF_VPP. The first and second boost voltage oscillators 260 and 270 respectively produce first and second oscillation signals VPP_OSC1 and VPP_OSC2 at a predetermined frequency in response to detection signals VPP_DET1 and VPP_DET2 of the boost voltage detecting unit 250. The first boost voltage charge pumping unit 280 drives a boost voltage terminal by performing a charge pumping operation in response to the first oscillation signal VPP_OSC1. The second boost voltage charge pumping unit 290 drives the boost voltage terminal by performing a charge pumping operation in response to the second oscillation signal VPP_OSC2.

The boost voltage detecting unit 250 outputs two detection signals VPP_DET1 and VPP_DET2 which are activated in a different activation section. When the semiconductor memory device operates in an active mode, a first detection signal VPP_DET1 that has a relative long activation section is outputted. When the semiconductor memory device operates in a standby mode, a second detection signal VPP_DET2 that has a relative short activation section is outputted. At this time, the boost voltage detecting unit 250 discriminates the standby or active mode of the semiconductor memory device in response to an active control signal ACT_CON.

The first and second boost voltage oscillators 260 and 270 output the first and second oscillation signals VPP_OSC1 and VPP_OSC2 in response to the first and second detection signal VPP_DET1 and VPP_DET2, respectively. The first oscillation signal VPP_OSC1 can have the same frequency as the second oscillation signal VPP_OSC2 or a different frequency. However, since a section where the first oscillation signal VPP_OSC1 is maintained in an oscillation state corresponds to an activation section of the first detection signal VPP_DET1 and a section where the second oscillation signal VPP_OSC2 is maintained in an oscillation state corresponds to an activation section of the second detection signal VPP_DET2, the oscillation section of the first oscillation signal VPP_OSC1 is longer than that of the second oscillation signal VPP_OSC2.

Accordingly, when the semiconductor memory device operates in an active mode, the first boost voltage charge pumping unit 280 operates for a relatively long time to drive the boost voltage terminal VPP. When the semiconductor memory device is operating in a standby mode, the second boost voltage charge pumping unit 290 operates for a relatively short time to drive the boost voltage terminal. This is because the boosted voltage VPP is frequently used while the semiconductor memory device is operating in the active mode.

As a result, the circuit to produce the back-bias voltage VBB starts the operation when the voltage level of the back-bias voltage VBB increases over a predetermined voltage level, regardless of the operation modes of the semiconductor memory device. On the other hand, the circuit to produce the boosted voltage VPP has a different driving force or time based on the active or standby mode of the semiconductor memory device to operate while the voltage level of the boost voltage VPP decreases below a predetermined voltage level.

Accordingly, since the driving force to increase the boost voltage VPP is relatively weak and the driving force to decrease the back-bias voltage VBB is maintained in a constant level during the standby mode of the semiconductor memory device, the voltage level fluctuation of the boost voltage VPP has a relatively small effect on the voltage level of the back-bias voltage VBB so that a predetermined back-bias voltage level can be maintained.

However, since the driving force to increase the boost voltage VPP is relatively strong and the driving force to decrease the back-bias voltage VBB is maintained in a constant level during the active mode of the semiconductor memory device, the voltage level fluctuation of the boost voltage VPP has a relatively large effect on the voltage level of the back-bias voltage VBB so that a predetermined back-bias voltage level is not maintained, but largely increased.

The fluctuation in the voltage level of the back-bias voltage, which is dependent upon the operation modes of the semiconductor memory device, causes the increase of the channel leakage current in a memory cell of the semiconductor memory device and also causes an unstable operation of a cell transistor. As a result, these shortages decrease the period of refresh in the semiconductor memory device.

SUMMARY OF THE INVENTION

Embodiments of the present invention are directed to providing a back-bias voltage generating circuit capable of maintaining a predetermined voltage level regardless of operation modes of a semiconductor memory device, by generating a back-bias voltage with the driving force changed according to the operation modes of a semiconductor memory device.

In accordance with an aspect of the invention, there is provided a semiconductor memory device, which includes an active pumping control signal generating unit for generating an active pumping control signal in response to a plurality of active signals, a voltage detecting unit for detecting a voltage level of a back-bias voltage terminal to output a detection signal, an oscillator for generating an oscillation signal oscillating at a predetermined frequency in response to the detection signal, a first charge pumping unit for driving the back-bias voltage terminal by performing a charge pumping operation in response to the oscillation signal and the active pumping control signal, and a second charge pumping unit for driving the back-bias voltage terminal by performing a charge pumping operation in response to the oscillation signal.

In accordance with an aspect of the invention, there is provided a semiconductor memory device, which includes an active pumping control signal generating unit for generating an active pumping control signal in response to a plurality of active signals, a voltage detecting unit for detecting a voltage level of a back-bias voltage terminal to output a detection signal, an oscillator for generating an oscillation signal oscillating at a predetermined frequency in response to the detection signal, and a charge pumping unit for performing a charge pumping operation in response to the oscillation signal by controlling a force of driving the back-bias voltage terminal in response to the active pumping control signal.

In accordance with an aspect of the invention, there is provided a method for driving a semiconductor memory device, which includes generating an active pumping control signal in response to a plurality of active signals, detecting a voltage level of a back-bias voltage terminal to output a detection signal, generating an oscillation signal oscillating at a predetermined frequency in response to the detection signal, and performing a charge pumping operation in response to the oscillation signal by controlling a force of driving the back-bias voltage terminal in response to the active pumping control signal.

The back-bias voltage generating circuit of the semiconductor memory device in accordance with the invention generates the back-bias voltage by using a plurality of bank active signals to be activated at the active mode of the semiconductor memory device. The back-bias voltage generating circuit drives a back-bias voltage terminal (VBB) with a relatively weak driving force at a standby mode of the semiconductor memory device and with a relatively strong driving force at an active mode of the semiconductor memory device.

Accordingly, current consumption can be reduced at the standby mode of the semiconductor memory device and the back-bias voltage VBB can be produced with a stable voltage level at the active mode of the semiconductor memory device regardless of the voltage level fluctuation of a boosted voltage VPP. Further, the semiconductor memory device can have a constant period of refresh.

DETAILED DESCRIPTION OF THE PREFERRED EMBODIMENTS

Hereinafter, the present invention will be described in detail through embodiments with reference to the accompanying drawings.

Figure 1:
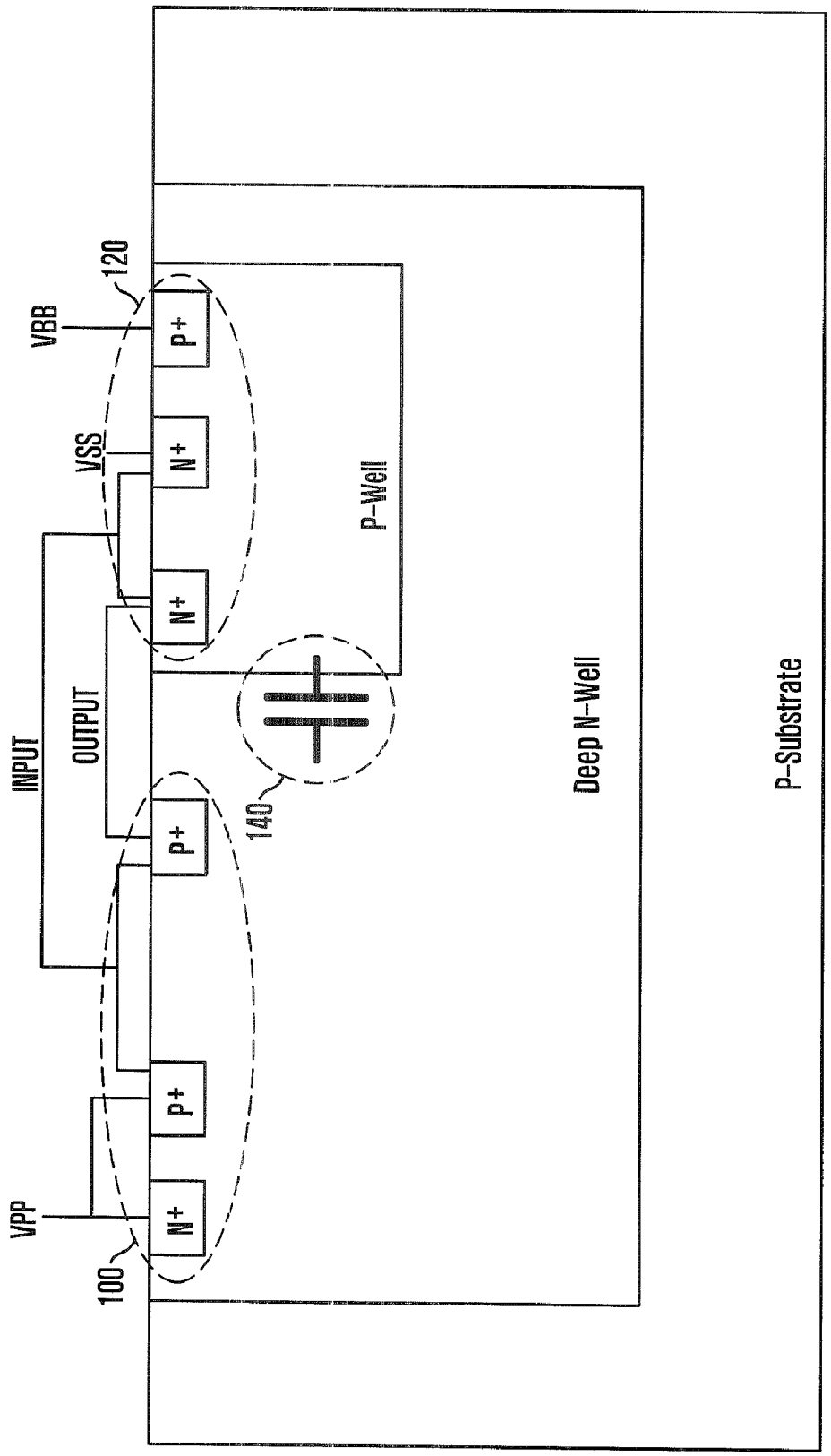
FIG. 1 is a cross-sectional view illustrating a structure of a MOS transistor used in a peripheral circuit in a conventional semiconductor memory device.
Figure 2:
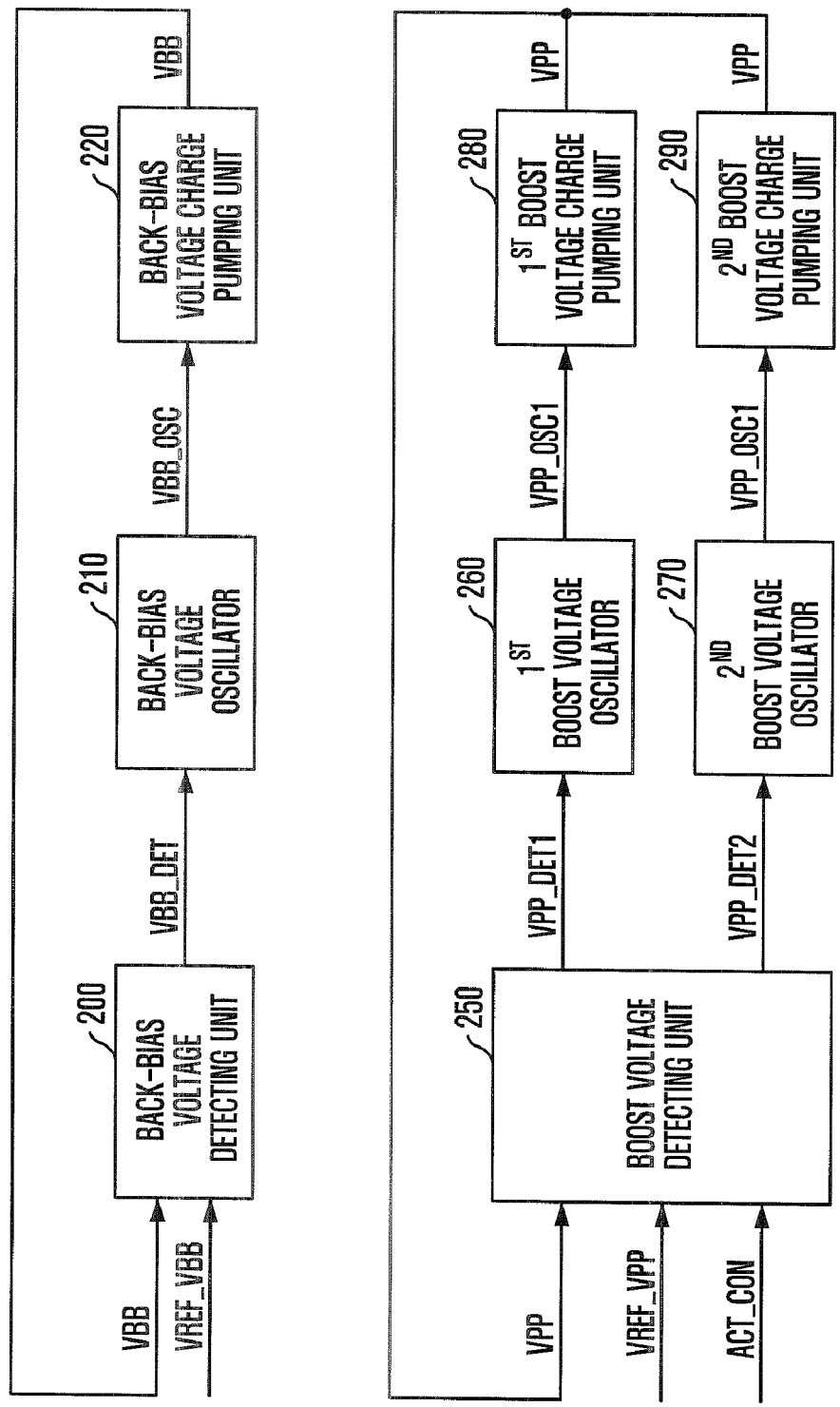
FIG. 2 is a block diagram illustrating a conventional circuit to generate a boosted voltage VPP and a back-bias voltage VBB of a semiconductor memory device.
Figure 3:
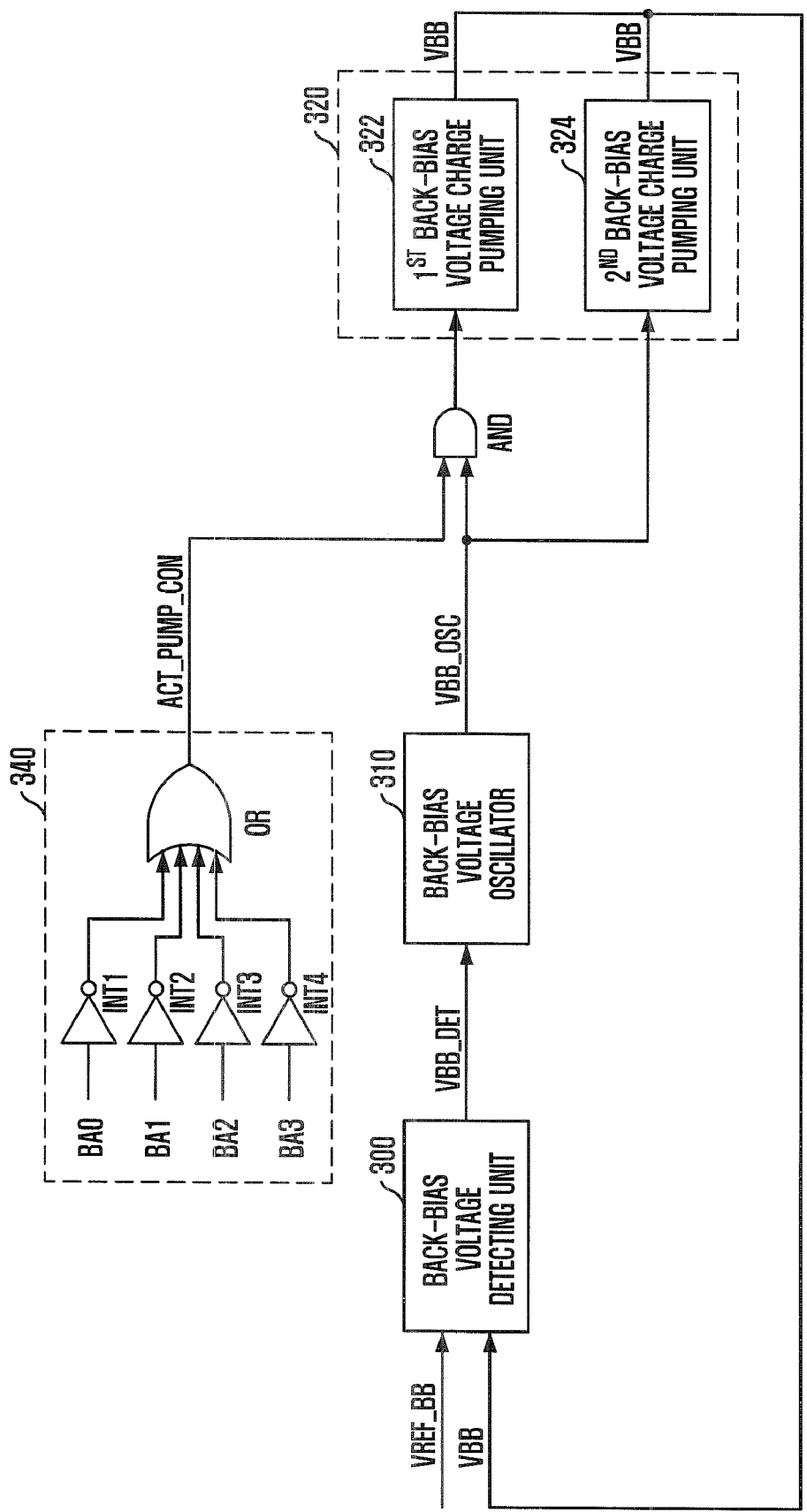
FIG. 3 is a block diagram illustrating a back-bias voltage generating circuit in accordance with an embodiment of to the present invention.

FIG. 3 is a block diagram illustrating a back-bias voltage generating circuit in accordance with an embodiment of the invention.

Referring to FIG. 3, the back-bias voltage generating circuit includes an active pumping control signal generating unit 340, a back-bias voltage detecting unit 300, a back-bias voltage oscillator 310, and a charge pumping unit 320. The active pumping control signal generating unit 340 generates an active pumping control signal ACT_PUMP_CON in response to a plurality of active signals BA0, BA1, BA2 and BA3. The back-bias voltage detecting unit 300 detects a voltage level of a back-bias voltage VBB. The back-bias voltage oscillator 310 generates an oscillation signal VBB_OSC oscillating at a predetermined frequency in response to a back-bias detection signal VBB_DET of the back-bias voltage detecting unit 300. The charge pumping unit 320 drives a back-bias voltage terminal by performing a charge pumping operation in response to the oscillation signal VBB_OSC and for changing the driving force in response to the active pumping control signal ACT_PUMP_CONT.

Here, the charge pumping unit 320 includes a first back-bias voltage charge pumping unit 322, and a second back-bias voltage charge pumping unit 324. The first back-bias voltage charge pumping unit 322 drives the back-bias voltage terminal by performing a charge pumping operation in response to both the oscillation signal VBB_OSC and the active pumping control signal ACT_PUMP_CONT. The second back-bias voltage charge pumping unit 324 drives the back-bias voltage terminal by performing a charge pumping operation in response to only the oscillation signal VBB_OSC.

The first back-bias voltage charge pumping unit 322 of the charge pumping unit 320 may drive the back-bias voltage terminal VBB by performing the charge pumping operation in response to an output signal of an AND gate AND to perform an AND operation of the oscillation signal VBB_OSC and the active pumping control signal ACT_PUMP_CONT. The AND gate AND may be included in the first back-bias voltage charge pumping unit 322.

The active pumping control signal generating unit 340 includes a plurality of inverters INT0, INT2, INT3 and INT4, and an OR gate OR. The plurality of inverters INT0, INT2, INT3 and INT4 receive and invert the plurality of active signals BA0, BA1, BA2 and BA3, respectively. The OR gate OR receives output signals of the plurality of inverters INT0, INT2, INT3 and INT4.

Figure 4:
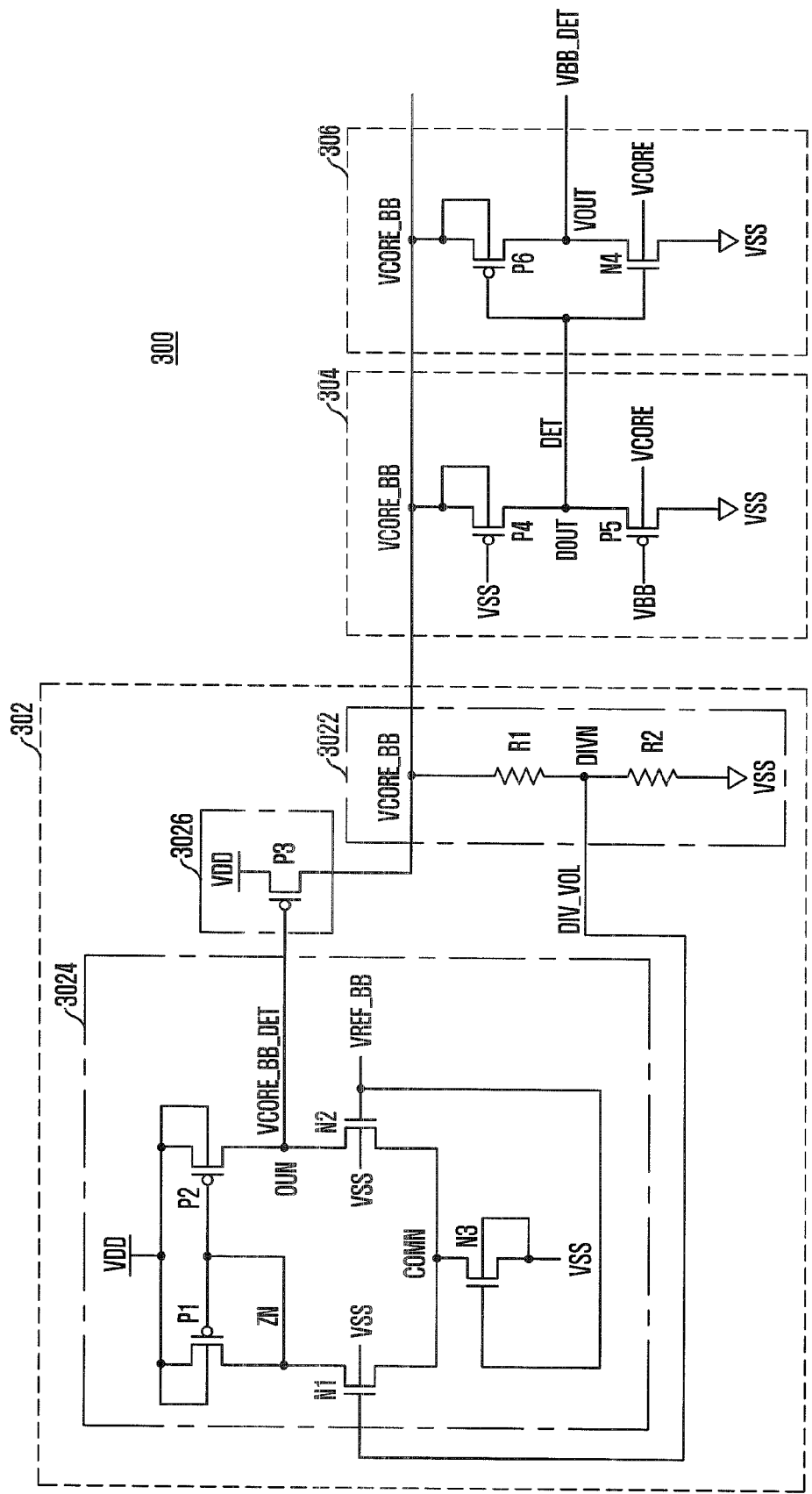
FIG. 4 is a schematic circuit diagram illustrating a back-bias voltage detecting unit of FIG. 3.

FIG. 4 is a circuit diagram illustrating the back-bias voltage detecting unit 300 of FIG. 3.

Referring to FIG. 4, the back-bias voltage detecting unit 300 includes a detection voltage generating unit 302, a voltage detecting unit 304, and a level shifting unit 306. The detection voltage generating unit 302 generates a detection power supply voltage VCORE_VBB based on a predetermined target level. The voltage detecting unit 304 outputs a detection voltage DET, which analogously varies according to the level of the back-bias voltage VBB, by using the detection power supply voltage VCORE_VBB as a power supply voltage. The level shifting unit 306 outputs the back-bias detection signal VBB_DET by logically changing the detection voltage DET based on a logic threshold voltage level corresponding to the level of the detection power supply voltage VCORE_VBB.

The detection voltage generating unit 302 includes a voltage divider 3022, a voltage comparator 3024, and a driving unit 3026. The voltage divider 3022 generates a division voltage DIV_VOL by dividing the detection power supply voltage VCORE_VBB at a predetermined division rate. The voltage comparator 3024 outputs a comparison signal VCORE_BB_DET by comparing the division voltage DIV_VOL with a reference voltage VREF_BB. The reference voltage VREF_BB is correspondent to the predetermined target level of the back-bias voltage VBB. The driving unit 3026 driving a detection power supply voltage terminal (VCORE_BB) in response to the comparison signal VCORE_BB_DET.

The voltage divider 3022 includes first and second resistors R1 and R2, which are connected to each other in series between the detection power supply voltage terminal (VCORE_BB) and a ground voltage terminal (VSS). The voltage divider 3022 outputs the division voltage DIV_VOL at the connection node DIVN of the resistors R1 and R2.

Further, the voltage comparator 3024 includes NMOS and PMOS transistors. A first NMOS transistor N1 has a drain and a source connected to a driving node ZN and a common node COMN, respectively. The first NMOS transistor N1 controls an amount of current flowing between the common node COMN and the driving node ZN in response to the division voltage DIV_VOL applied to a gate thereof. A second NMOS transistor N2 has a drain and a source connected to an output node OUN and the common node COMN, respectively. The second NMOS transistor N2 controls an amount of current flowing between the common node COMN and the output node OUN in response to the reference voltage VREF_BB, which is applied to a gate thereof. A first and a second PMOS transistors P1 and P2 are coupled to each other in a current mirror type between the driving node ZN and the output node OUN. The first and the second PMOS transistors P1 and P2 control an amount of current flowing into the driving node ZN and the output node OUN to make these amounts of the current the same. A third NMOS transistor N3 has a drain and a source connected to the common node COMN and the ground voltage terminal, respectively. The third NMOS transistor N3 controls an amount of current between the common node COMN and the ground voltage terminal (VSS) in response to the reference voltage VREF_BB, which is applied to a gate thereof.

The driving unit 3026 includes a PMOS transistor P3 for controlling an amount of current flowing from a power supply voltage terminal (VDD) to the detection power supply voltage terminal (VCORE_BB) in response to the comparison signal VCORE_BB_DET applied to a gate thereof. The PMOS transistor P3 has a drain and a source connected to the detection power supply voltage terminal (VCORE_BB) and the power supply voltage terminal (VDD), respectively.

The voltage detecting unit 304 includes first and second PMOS transistors P1 and P2, which are connected to each other in series between the detection power supply voltage terminal (VCORE_BB) and the ground voltage terminal (VSS). The first PMOS transistor P4 makes an amount of current between the detection power supply voltage terminal (VCORE_VBB) and a detecting voltage output terminal (DOUT), which are source-drain_connected to the first PMOS transistor P4, in a constant value, by receiving the ground voltage VSS through a gate thereof. The second PMOS transistor P2 controls an amount of current between the detecting voltage output terminal (DOUT) and the ground voltage terminal (VSS), which are source-drain connected to the second PMOS transistor P5, in response to the back-bias voltage VBB applied to a gate thereof.

The level shifting unit 306 includes a PMOS transistor P6 and a NMOS transistor N4, which are connected to each other in series between the detection power supply voltage terminal (VCORE_VBB) and the ground voltage terminal (VSS). The PMOS transistor P6 controls an electrical connection between the detection power supply voltage terminal (VCORE_VBB) and a back-bias detection signal output terminal VOUT in response to the voltage level of the detection voltage DET applied to a gate thereof. The NMOS transistor N4 controls an electrical connection between the back-bias detection signal output terminal VOUT and the ground voltage terminal (VSS) in response to the voltage level of the detection voltage DET applied to a gate thereof.

For reference, the above-mentioned logic threshold voltage level is used as a reference level to determine whether a logic level of the back-bias detection signal VBB_DET is a logic "low" or "high" level. When the logic level of the inputted detection voltage DET is higher than the logic threshold voltage level, the back-bias detection signal VBB_DET is outputted as a logic low level signal. When the logic level of the inputted detection voltage DET is lower than the logic threshold voltage level, the back-bias detection signal VBB_DET is outputted as a logic high level signal.

The detailed operation of the back-bias voltage generating circuit according to the invention will be described in detail below.

First, the back-bias voltage detecting unit 300 activates the back-bias detection signal VBB_DET when the voltage level of the back-bias voltage terminal (VBB) is lower than the predetermined target level. The back-bias voltage detecting unit 300 deactivates the back-bias detection signal VBB_DET when the voltage level of the back-bias voltage terminal (VBB) is higher than the predetermined target level.

The back-bias voltage oscillator 310 outputs the oscillation signal VBB_OSC oscillating at the predetermined frequency when the back-bias detection signal VBB_DET is activated. On the contrary, when the back-bias detection signal VBB_DET is deactivated, the back-bias voltage oscillator 310 outputs the oscillation signal VBB_OSC in a constant level without an oscillation.

Also, when the active pumping control signal ACT_PUMP_CON is activated and the oscillation signal VBB_OSC is simultaneously oscillating at the predetermined frequency, the charge pumping unit 320 drives the back-bias voltage terminal (VBB) with a relatively strong driving force. Meanwhile, when the active pumping control signal ACT_PUMP_CON is deactivated and the oscillation signal VBB_OSC is oscillating at the predetermined frequency, the charge pumping unit 320 drives the back-bias voltage terminal (VBB) with a relatively weak driving force.

Even if the active pumping control signal ACT_PUMP_CON is activated or deactivated, the back-bias voltage terminal (VBB) is not driven when the oscillation signal VBB_OSC is not oscillating and is maintained in a constant voltage level. That is, when the oscillation signal VBB_OSC is not oscillating and is maintained in a constant voltage level, the back-bias voltage terminal (VBB) is not driven regardless of the logic level of the active pumping control signal ACT_PUMP_CON.

More concretely, when the active pumping control signal ACT_PUMP_CON is activated and the oscillation signal VBB_OSC is simultaneously oscillating at the predetermined frequency, the first back-bias voltage charge pumping unit 322 of the charge pumping unit 320 drives the back-bias voltage terminal (VBB). At this time, the second back-bias voltage charge pumping unit 324 of the charge pumping unit 320 also drives the back-bias voltage terminal (VBB) because the oscillation signal VBB_OSC is being oscillating at the predetermined frequency.

That is, when the active pumping control signal ACT_PUMP_CON is activated and the oscillation signal VBB_OSC is simultaneously oscillating at the predetermined frequency, all of the first and second back-bias voltage charge pumping units 322 and 324 drive the back-bias voltage terminal (VBB). Accordingly, the back-bias voltage terminal (VBB) is driven by a relatively strong driving force.

When the active pumping control signal ACT_PUMP_CON is deactivated and the oscillation signal VBB_OSC is simultaneously oscillating at the predetermined frequency, the first back-bias voltage charge pumping unit 322 does not drive the back-bias voltage terminal (VBB) because the active pumping control signal ACT_PUMP_CON is in the inactive state. At this time, the second back-bias voltage charge pumping unit 324 drives the back-bias voltage terminal (VBB) because the oscillation signal VBB_OSC is oscillating at the predetermined frequency.

That is, when the active pumping control signal ACT_PUMP_CON is deactivated and the oscillation signal VBB_OSC is simultaneously oscillating at the predetermined frequency, although the first back-bias voltage charge pumping unit 322 does not drive the back-bias voltage terminal (VBB), the second back-bias voltage charge pumping unit 324 drives the back-bias voltage terminal (VBB). The back-bias voltage terminal (VBB) is weakly driven by only the second back-bias voltage charge pumping unit 324. Accordingly, the driving force provided by only the second back-bias voltage charge pumping unit 324 is less than that provided by the first and second back-bias voltage charge pumping units 322 and 324.

Further, when the oscillation signal VBB_OSC is not oscillating and is maintained in a constant voltage level, all of the first and second back-bias voltage charge pumping units 322 and 324 are not involved in driving the back-bias voltage terminal (VBB).

As mentioned above, the back-bias voltage generating circuit according to the invention can change the driving force of generating the back-bias voltage by using a plurality of bank active signals BA0, BA1, BA2 and BA3 of which logic levels are determined in response to the active or standby mode of the semiconductor memory device.

That is, in the active mode of the semiconductor memory device wherein at least one of the plurality of bank active signals BA0, BA1, BA2 and BA3 is activated, the back-bias voltage is produced by a relatively strong driving force. At the standby mode wherein all of the plurality of bank active signals BA0, BA1, BA2 and BA3 are deactivated, the back-bias voltage is produced by a relatively weak driving force.

On the other hand, the conventional back-bias voltage generating circuit drives the back-bias voltage VBB with a constant driving force regardless of the operation modes of the semiconductor memory device such that an over-driving back-bias voltage in the standby mode of the semiconductor memory device may cause unnecessary power consumption. However, in the invention, the driving force of the back-bias voltage VBB is controlled by the operation modes of the semiconductor memory device and, therefore, the unnecessary power consumption caused by the conventional back-bias voltage generating circuit is prevented.

Furthermore, in the active mode of the semiconductor memory device, the back-bias voltage generating circuit according to the invention prevents the level fluctuation of the back-bias voltage VBB, which can be caused by the level fluctuation of the boosted voltage VPP in the conventional circuit because the driving force of the back-bias voltage terminal (VBB), from being too weak.

As apparent from the above, the invention generates the back-bias voltage VBB which is maintained in the predetermined voltage level regardless of the operation modes of the semiconductor memory device and this makes it possible to operate the semiconductor memory device with a constant period of refresh.

While the invention has been described with respect to the particular embodiments, it will be apparent to those skilled in the art that various changes and modifications may be made without departing from the spirit and scope of the invention as defined in the following claims. For example, the transistor and the logic gates can be change based on the polarity of the input and output signals and the position thereof. In addition, although four bank signals corresponding to four banks are illustrated in the embodiment, these numbers of the banks can be changed to a large or small number.

What is claimed is:

1. A semiconductor memory device comprising:
an active pumping control signal generating unit configured to generate an active pumping control signal in response to a plurality of active signals;
a voltage detecting unit configured to detect a voltage level of a back-bias voltage terminal to output a detection signal;
an oscillator configured to generate an oscillation signal oscillating at a predetermined frequency in response to the detection signal;
a first charge pumping unit configured to drive the back-bias voltage terminal by performing a charge pumping operation in response to the oscillation signal and the active pumping control signal; and
a second charge pumping unit configured to drive the back-bias voltage terminal by performing a charge pumping operation in response to the oscillation signal.

2. The semiconductor memory device of claim 1, wherein the voltage detecting unit is configured to activate the detection signal when the voltage level of the back-bias voltage terminal is lower than a predetermined voltage level and to deactivate the detection signal when the voltage level of the back-bias voltage terminal is higher than the predetermined voltage level.

3. The semiconductor memory device of claim 2, wherein the oscillator is configured to output the oscillation signal, which oscillates at the predetermined frequency, in response to an activation of the detection signal and to output the oscillation signal in a constant voltage level in response to a deactivation of the detection signal.

4. The semiconductor memory device of claim 1, wherein the first charge pumping unit is configured to drive the back-bias voltage terminal when the active pumping control signal is activated and the oscillation signal is oscillating at the predetermined frequency.

5. The semiconductor memory device of claim 1, wherein the second charge pumping unit is configured to drive the back-bias voltage terminal when the oscillation signal is oscillating at the predetermined frequency.

6. The semiconductor memory device of claim 1, wherein the active pumping control signal generating unit is configured to activate the active pumping control signal in response to an activation of at least one of the plurality of active signals.

7. The semiconductor memory device of claim 1, wherein the voltage detecting unit includes:
a detection voltage generating unit configured to generate a detection power supply voltage based on a predetermined target level;
a voltage sensing unit configured to output a detection voltage, which varies according to the voltage level of the back-bias voltage terminal, by using the detection power supply voltage; and
a level shifting unit configured to output the detection signal by logically changing the detection voltage based on a logic threshold voltage level corresponding to a level of the detection power supply voltage.

8. A method of driving a semiconductor memory device, the method comprising:
generating an active pumping control signal in response to a plurality of active signals;
detecting a voltage level of a back-bias voltage terminal to output a detection signal;
generating an oscillation signal oscillating at a predetermined frequency in response to the detection signal;
performing a charge pumping operation with a first charge pumping unit in response to the oscillation signal to drive the back-bias voltage terminal; and
performing a charge pumping operation with a second charge pumping unit in response to the oscillation signal and the active pumping control signal to additionally drive the back-bias voltage terminal.

9. The method of claim 8, wherein performing the charge pumping operation in response to the oscillation signal and the active pumping control signal includes:
driving the back-bias voltage terminal when the active pumping control signal is activated and the oscillation signal is oscillating at the predetermined frequency; and
stopping the driving of the back-bias voltage terminal, regardless of the active pumping control signal, when the oscillation signal is deactivated.

10. The method of claim 8, wherein detecting the voltage level includes:
generating a detection power supply voltage based on a predetermined target level;
outputting a detection voltage, which varies according to the voltage level of the back-bias voltage terminal, by using the detection power supply voltage; and
outputting the detection signal by logically changing the detection voltage based on a logic threshold voltage level corresponding to a level of the detection power supply voltage.

* * * * *